United States Patent
Kim et al.

(10) Patent No.: US 10,310,940 B2
(45) Date of Patent: Jun. 4, 2019

(54) METHOD FOR EXTENDING LIFETIME OF RESISTIVE CHANGE MEMORY AND DATA STORAGE SYSTEM USING THE SAME

(71) Applicants: SK hynix Inc., Icheon (KR); Korea University Research and Business Foundation, Seoul (KR)

(72) Inventors: Seon Wook Kim, Namyangju (KR); Miseon Han, Daegu (KR); Hokyoon Lee, Icheon (KR); Il Park, Icheon (KR)

(73) Assignees: SK HYNIX INC., Icheon (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 3 days.

(21) Appl. No.: 15/641,158

(22) Filed: Jul. 3, 2017

(65) Prior Publication Data

US 2018/0039539 A1    Feb. 8, 2018

(30) Foreign Application Priority Data

Aug. 4, 2016  (KR) .......................... 10-2016-0099479

(51) Int. Cl.
*G06F 11/10*   (2006.01)
*G06F 3/06*    (2006.01)
(Continued)

(52) U.S. Cl.
CPC .......... *G06F 11/1068* (2013.01); *G06F 3/064* (2013.01); *G06F 3/0616* (2013.01);
(Continued)

(58) Field of Classification Search
CPC .... G06F 11/1068; G06F 3/0616; G06F 3/064; G06F 3/0679; G11C 7/1006;
(Continued)

(56) References Cited

U.S. PATENT DOCUMENTS 7,814,033 B2 * 10/2010 Hou ........................ G06F 21/75
                                                              706/13
7,894,448 B1 *  2/2011 Lillibridge ............. G06Q 30/02
                                                              370/389

(Continued)

OTHER PUBLICATIONS

An et al., Balancing the Lifetime and Storage Overhead on Error Correction for Phase Change Memory, Jul. 9, 2015,PLOS ONE, pp. 1-16.*

(Continued)

*Primary Examiner* — John J Tabone, Jr.

(57) ABSTRACT

A method for extending the lifetime of a resistive change memory includes generating data and hash candidates by shuffling bit positions of write data with the hash candidates in response to a write request for the resistive change memory, calculating Hamming distances of the generated data and hash candidates from stored data and a stored hash, matching stuck data at a predetermined bit in the resistive change memory with the generated data and hash candidates when the stuck data is at the predetermined bit, and excluding mismatched data and hash candidates that are mismatched with the stuck data among the generated data and hash candidates, finding a data and hash candidate with the shortest Hamming distance among the matched data and hash candidates, and choosing the found data and hash candidate as an encoded data and hash, and storing the encoded data and hash in the resistive change memory.

20 Claims, 4 Drawing Sheets

(51) Int. Cl.
*G11C 13/00* (2006.01)
*G11C 29/52* (2006.01)
*G11C 7/10* (2006.01)
*G11C 11/16* (2006.01)

(52) U.S. Cl.
CPC .......... *G06F 3/0679* (2013.01); *G06F 11/108* (2013.01); *G06F 11/1012* (2013.01); *G11C 7/1006* (2013.01); *G11C 11/1675* (2013.01); *G11C 13/004* (2013.01); *G11C 13/0023* (2013.01); *G11C 13/0035* (2013.01); *G11C 13/0069* (2013.01); *G11C 29/52* (2013.01); *G11C 11/1673* (2013.01)

(58) Field of Classification Search
CPC ............ G11C 11/1675; G11C 13/0023; G11C 13/0035; G11C 13/004; G11C 13/0069; G11C 29/52; G11C 11/1673
USPC ................ 714/764, 768, 769, 773, 777, 799
See application file for complete search history.

(56) References Cited

U.S. PATENT DOCUMENTS

| | | | | |
|---|---|---|---|---|
| 8,141,152 | B1* | 3/2012 | Hwang | H04L 63/0227 370/242 |
| 8,443,261 | B2* | 5/2013 | Waldspurger | G06F 11/08 714/53 |
| 8,464,135 | B2* | 6/2013 | Erez | G06F 11/1004 714/763 |
| 8,812,934 | B2 | 8/2014 | Guyot et al. | |
| 8,887,025 | B2 | 11/2014 | Mateescu et al. | |
| 8,892,980 | B2* | 11/2014 | Fillingim | G06F 11/1048 714/760 |
| 8,996,955 | B2 | 3/2015 | Franca-Neto et al. | |
| 9,235,465 | B2 | 1/2016 | Cho et al. | |
| 9,274,884 | B2 | 3/2016 | Mateescu et al. | |
| 9,384,144 | B1* | 7/2016 | Yeung | G06F 11/1016 |
| 9,916,254 | B2* | 3/2018 | Yeung | G06F 11/1016 |
| 2003/0065406 | A1* | 4/2003 | Hou | G06F 21/75 700/11 |
| 2005/0038774 | A1* | 2/2005 | Lillibridge | G06Q 30/02 |
| 2005/0138495 | A1* | 6/2005 | Jedwab | G11C 11/16 714/718 |
| 2006/0106857 | A1* | 5/2006 | Lillibridge | G06F 17/30085 |
| 2007/0276843 | A1* | 11/2007 | Lillibridge | G06F 17/30073 |
| 2008/0037544 | A1* | 2/2008 | Yano | H04L 45/00 370/392 |
| 2011/0225128 | A1* | 9/2011 | Jarrett | G06F 8/61 707/692 |
| 2011/0307758 | A1* | 12/2011 | Fillingim | G06F 11/1048 714/758 |
| 2011/0314354 | A1* | 12/2011 | Fillingim | G06F 11/1048 714/760 |
| 2012/0017138 | A1* | 1/2012 | Erez | G06F 11/1004 714/773 |
| 2012/0266048 | A1* | 10/2012 | Chung | G06F 11/10 714/768 |
| 2012/0324294 | A1* | 12/2012 | Yamada | G06F 11/1004 714/42 |
| 2013/0159261 | A1* | 6/2013 | Dewey | G06F 17/30156 707/692 |
| 2013/0262880 | A1* | 10/2013 | Pong | G06F 12/1441 713/193 |
| 2015/0301933 | A1* | 10/2015 | Tuers | G06F 12/0246 714/773 |
| 2016/0283323 | A1* | 9/2016 | Yeung | G06F 11/1016 |
| 2017/0109096 | A1* | 4/2017 | Jean | G06F 3/0659 |
| 2017/0199921 | A1* | 7/2017 | Khanlarov | G06Q 30/01 |
| 2017/0344299 | A1* | 11/2017 | Ivanov | B60W 10/04 |
| 2018/0137003 | A1* | 5/2018 | Pignatelli | G06F 11/0793 |

OTHER PUBLICATIONS

Sangyeun Cho et al., "Flip-N-Write: A Simple Deterministic Techniques to Improve PRAM Write Performance, Energy and Endurance", MICRO'09, Dec. 2009, pp. 1-11, IEEE.

Nak Hee Seong et al., "SAFER: Stuck-At-Fault Error Recovery for Memories", MICRO'10, Dec. 2010, pp. 1-10, IEEE.

* cited by examiner

[Fig. 1]
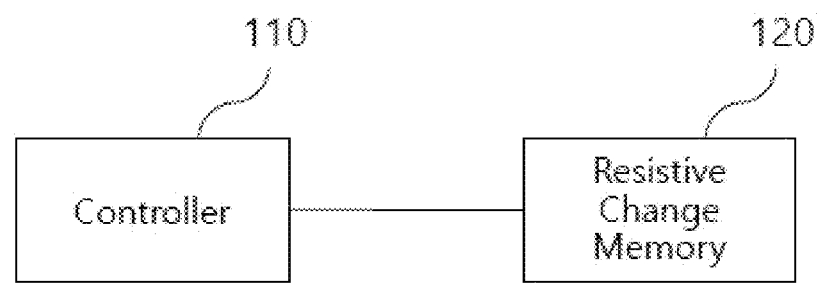
100

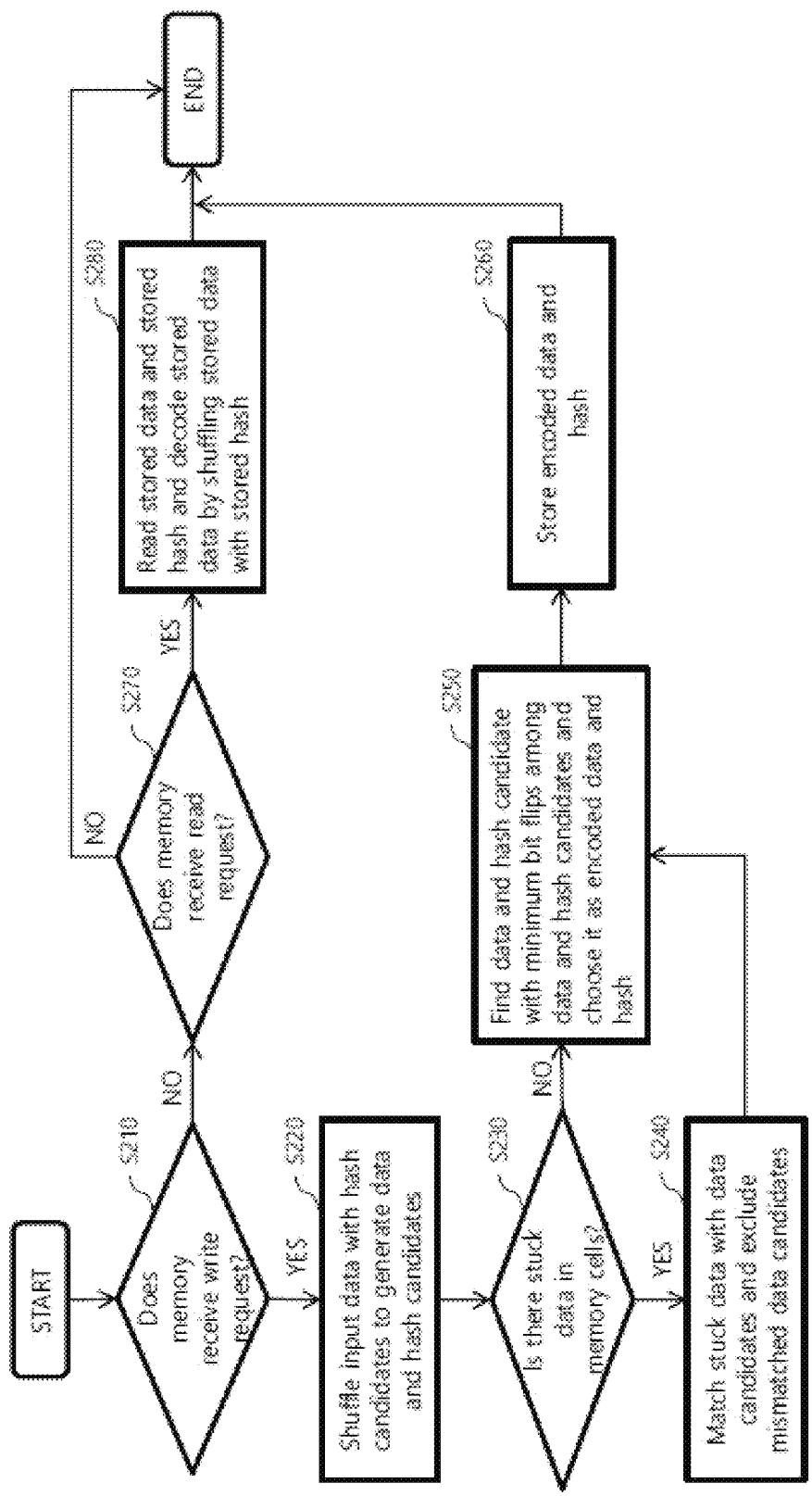
[Fig. 2]

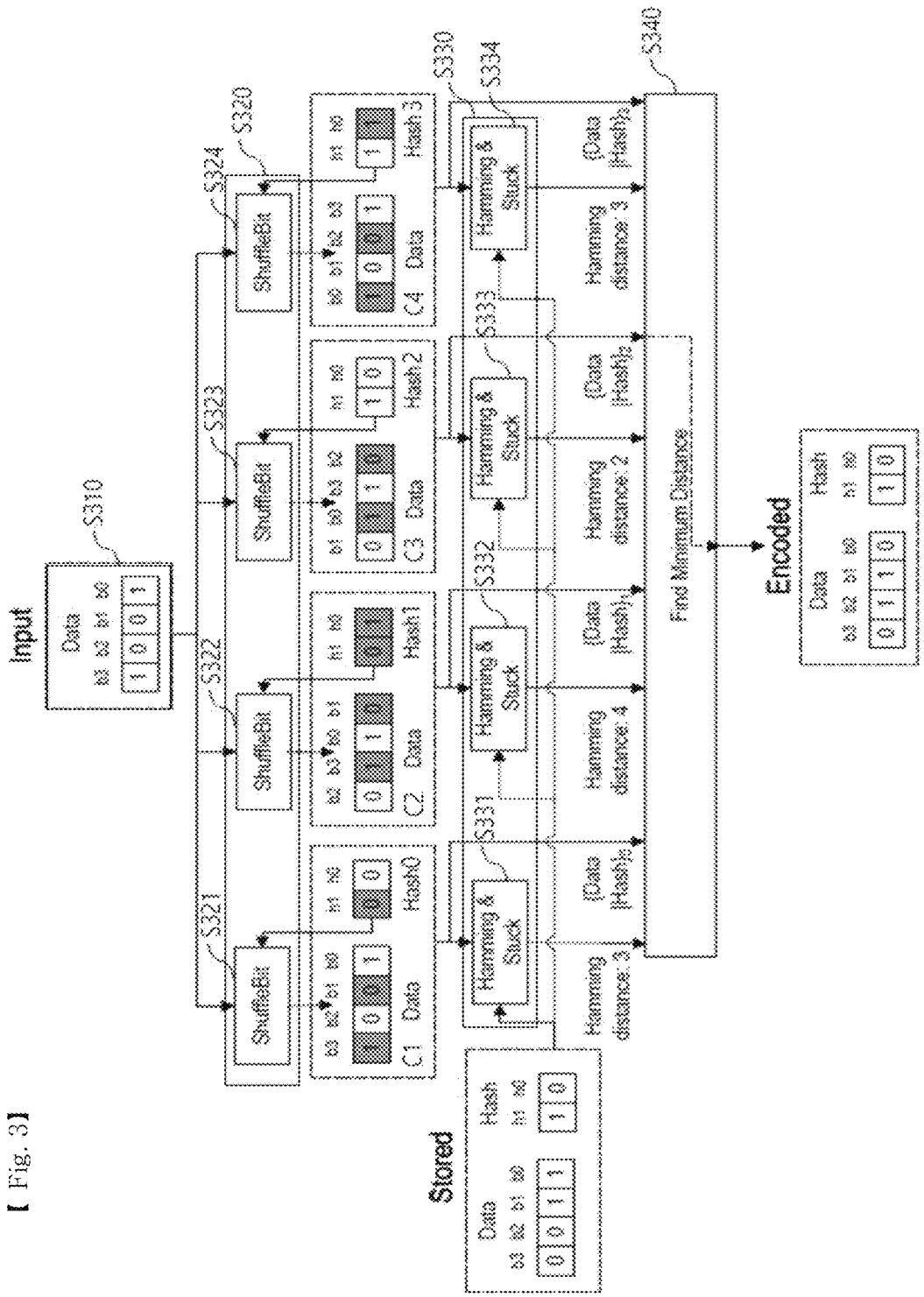
[ Fig. 3 ]

【Fig. 4】
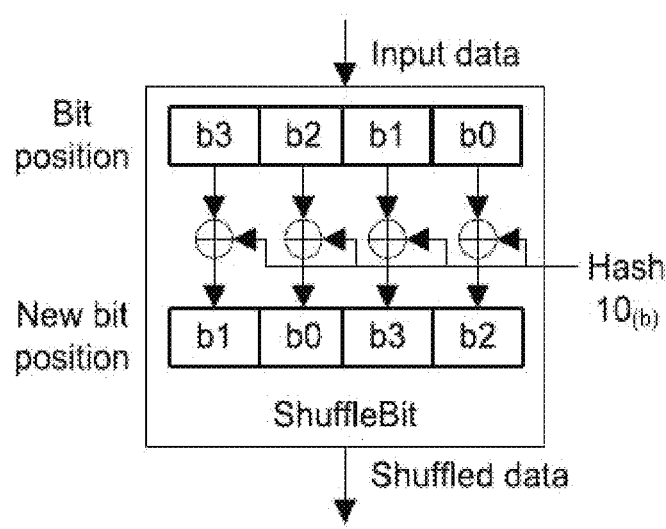

METHOD FOR EXTENDING LIFETIME OF RESISTIVE CHANGE MEMORY AND DATA STORAGE SYSTEM USING THE SAME

CROSS-REFERENCE TO RELATED APPLICATIONS

The present application claims priority to Korean Patent Application No. 10-2016-0099479, filed on Aug. 4, 2016, which is incorporated herein by reference in its entirety.

BACKGROUND

1. Field

Various embodiments relate to a method for extending the lifetime of a resistive change memory, and more particularly, to a method capable of extending the lifetime of a resistive change memory by changing bit positions of data to be written during a write operation in order to minimize bit flips, and a data storage system using the same.

2. Description of the Related Art

With the rapid development of mobile and digital information communications and expansion of the home appliances industry, research based on charge control of electrons is near to its limit. Thus, there is a demand for the development of a functional memory device based on a new concept replacing the charge control. In particular, in order to satisfy the demand for high capacity memories in most information devices, next-generation, high-capacity, ultra-high-speed, low-power memory devices need to be developed.

Currently, a resistive change memory using a variable resistance material as a memory medium has been suggested as a next-generation memory device.

The resistive change memory has more advantages than a conventional nonvolatile flash memory. The resistive change memory is byte-addressable like a DRAM, but can secure a two to four time higher capacity than the DRAM at the same cost. Furthermore, the resistive change memory has a higher read speed than other nonvolatile memories. Thus, the resistive change memory is expected to replace a considerable part of DRAMs in a server system, which requires a high capacity at a low cost.

However, the resistive change memory requires a large amount of energy during a write operation and has a long delay time. Furthermore, the resistive change memory has a finite lifetime while the DRAM has an infinite lifetime. Above all things, the resistive change memory may cause many errors due to deterioration of memory cells according to repeated write operations. For example, when the resistive change memory repeats write operations $10^7$ to $10^8$ times, a stuck-at fault may occur in a memory cell. When the corresponding fault is not cured, a system failure occurs.

Furthermore, when a bit flip occurs while data are written into the resistive change memory, energy may be consumed for the bit flip. In addition, when a write time increases in the resistive change memory, a fault may easily occur in a corresponding memory cell.

SUMMARY

Various embodiments are directed to a method for extending the lifetime of a resistive change memory by performing a write operation while changing bit positions of data, which are to be written, in order to minimize bit flips.

In accordance with an embodiment, a method for improving the lifetime of a resistive change memory may require hashes to change the bit positions of data to be stored, and include making data and hash candidates by changing the bit positions of the data to be stored.

In an embodiment, a method for extending the lifetime of a resistive change memory may include: generating data and hash candidates by shuffling bit positions of write data with the hash candidates in response to a write request for the resistive change memory; calculating Hamming distances of the generated data and hash candidates from stored data and a stored hash; matching stuck data at a predetermined bit in the resistive change memory with the generated data and hash candidates when the stuck data is at the predetermined bit, and excluding mismatched data and hash candidates that are mismatched with the stuck data among the generated data and hash candidates; finding a data and hash candidate with the shortest Hamming distance among the matched data and hash candidates, and choosing the found data and hash candidate as an encoded data and hash; and storing the encoded data and hash in the resistive change memory.

The method may further include; determining whether the resistive change memory receives a read request without receiving the write request for the resistive change memory; and reading the stored data and the stored hash and decoding the stored data by shuffling bit positions of the stored data with the stored hash when the resistive change memory receives the read request.

The generating of the data and hash candidates may include generating the data and hash candidates by performing XOR operations on the bit positions of the write data and each of the hash candidates.

The generating of the data and hash candidates may include generating the data and hash candidates by performing XNOR operations on the bit positions of the write data and each of the hash candidates.

The number of the generated data and hash candidates may indicate the number of data bits written at each write time.

The decoding of the stored data may include generating decoded data by performing XOR operations on the stored hash and the bit positions of the stored data.

The decoding of the stored data may include generating decoded data by performing XNOR operations on the stored hash and the bit positions of the stored data.

In an embodiment, a method for extending the lifetime of a resistive change memory may include: generating data and hash candidates by shuffling bit positions of write data with the hash candidates when the resistive change memory receives a write request; calculating Hamming distances of the generated data and hash candidates from stored data and a stored hash; finding a data and hash candidate with the shortest Hamming distance among the generated data and hash candidates and choosing the found data and hash candidate as an encoded data and hash; and storing the encoded data and hash in the resistive change memory.

The method may further include: determining whether the resistive change memory receives a read request when the resistive change memory has not received a write request; and reading the stored data and the stored hash and decoding the stored data by shuffling bit positions of the stored data with the stored hash when the resistive change memory receives the read request.

In an embodiment, a data storage system may include: a controller configured to generate data and hash candidates by shuffling bit positions of write data with the hash candidates, calculating Hamming distances of the generated data and hash candidates from stored data and a stored hash, matching stuck data at a predetermined bit in a resistive change memory with the generated data and hash candidates when there is the stuck data at the predetermined bit, excluding mismatched data and hash candidates that are mismatched with the stuck data among the generated data and hash candidates, choosing a data and hash candidate with the shortest Hamming distance among the matched data and hash candidates as an encoded data and hash, and storing the encoded data and hash in the resistive change memory.

The shuffling operation may include an XOR or XNOR operation.

In an embodiment, a data storage system may include: a controller configured to generate data and hash candidates by shuffling bit positions of write data with the hash candidates when a resistive change memory receives a write request, calculating Hamming distances of the generated data and hash candidates from stored data and a stored hash, choosing a data and hash candidate with the shortest Hamming distance among the generated data and hash candidates as an encoded data and hash, and storing the encoded data and hash in the resistive change memory.

BRIEF DESCRIPTION OF THE DRAWINGS

FIG. 1 illustrates a data storage system in accordance with an embodiment.

FIG. 2 is a flowchart illustrating an operation of a controller in accordance with an embodiment.

FIG. 3 illustrates a data encoding process in a write operation in accordance with an embodiment.

FIG. 4 illustrates a logic operation for combining data in accordance with an embodiment.

DETAILED DESCRIPTION

A resistive change memory in accordance with an embodiment may basically include an access element and a resistive element, and may store data "0" or "1" depending on a resistance state of the resistive element.

A type of a resistive change memory in accordance with an embodiment may be decided according to a material of a variable resistance element. For example, the variable resistance element may be formed of a resistive material or PCMO ($Pr_{0.3}Ca_{0.7}MnO_3$) in case of a ReRAM, formed of chalcogenide in case of a PCRAM, formed of a magnetic layer of a magnetization material in case of an MRAM, and formed of a magnetization reversal layer of a magnetization material in case of an STT-M RAM.

Hereafter, various embodiments will be described in detail with reference to the accompanying drawings. The terms used in this specification and claims should not be limited to typical or dictionary definitions, but should be analyzed as definitions and concepts that coincide with the technical idea of the present disclosure, based on the principle that the inventor can act as his or her own lexicographer. Therefore, embodiments described in this specification and configurations illustrated in the drawings are only preferred embodiments and do not represent the entire technical idea of the present disclosure. Thus, various equivalent and modifications capable of replacing the embodiments may be provided at the point of time that this specification is filed.

FIG. 1 illustrates a data storage system 100 in accordance with an embodiment.

The data storage system 100 may include a controller 110 and a resistive change memory 120. The controller 110 may include a memory control circuit, a processor circuit, or any control circuit for writing data to the resistive change memory 120 or for reading data from the resistive change memory 120. Data may be transmitted between the controller 110 and the resistive change memory 120 through one or more of on-chip buses, external buses, and signal lines that are not buses. The controller 110 and the resistive change memory 120 may be arranged in the same integrated circuit or separate integrated circuits. For example, the data storage system 100 may include two separate integrated circuits respectively including the controller 110 and the resistive change memory 120.

FIG. 2 is a flowchart illustrating an operation of the controller 110 of FIG. 1 in accordance with an embodiment. The operation of the controller 110 shown in FIG. 2 will be described with reference to FIG. 1. When it is determined that the resistive change memory 120 receives a write request at S210, the controller 110 may generate data and hash candidates by shuffling input data with the hash candidates at S220.

When it is determined that there is stuck data in memory cells at S230, the controller 110 may match the stuck data of a corresponding bit with the data candidates, and exclude data candidates that are mismatched with the stuck data of the corresponding bit, at S240.

The controller 110 may find a data and hash candidate with minimum bit flips (e.g., a Hamming distance) among the matched data and hash candidates, which contain data coinciding with the stuck data of the corresponding bit, and choose the data and hash candidate with the minimum bit flips as an encoded data and hash, at S250.

Then, the controller 110 may store the encoded data and hash in the resistive change memory 120 at S260, and end a write operation.

When it is determined that there is no write request for the resistive change memory 120 at S210, the controller 110 may determine whether the resistive change memory 120 receives a read request, at S270. When it is determined that the resistive change memory 120 receives the read request, the controller 110 may read stored data and a stored hash, and decode the stored data by shuffling the stored data with the stored hash, at S280, and the controller 110 may end a read operation.

When it is determined that there is no stuck data in the memory cells at S230, the controller 110 may perform the processes of S250 and S260 and end the write operation.

FIG. 3 illustrates a data encoding process in a write operation in accordance with an embodiment. The date encoding process illustrated in FIG. 3 will be described with reference to FIG. 1.

The present embodiment may be based on the supposition that stored data is "0011," a stored hash is "10," and data to be written, i.e., write data, is "1001." The write data "1001" is input at S310.

The controller 110 may acquire data candidates by shuffling bit positions of the write data "1001" with each of hash candidates including "00," "01," "10," and "11," at sub-processes S321 to S324 of S320. In accordance with the present embodiment, the number of data candidates may be set to N. Here, N may represent the number of data bits written at each write time. The shuffling operation in accordance with the present embodiment may include an XOR operation. In another embodiment, the shuffling operation may include an XNOR operation. The result values of FIG. 3 may be obtained by performing the XOR operation.

The controller 110 may calculate the number of bit flips by comparing bits of data and hash candidates C1 to C4 with bits of the stored data and hash one by one, at S330. That is, the controller 110 may compare each bit of the first data and hash candidate C1, e.g., "100100," with a corresponding bit of the stored data and hash, e.g., "001110," and determines the number of bit flips based on the comparison results at S331. In other words, the controller 110 may calculate the Hamming distance of the data and hash candidate C1 from the stored data and hash. The numbers of bit flips of the other data and hash candidates C2 to C4 may be calculated in the same manner at S332 to S334, respectively. At this time, S331 to S334 may be performed in parallel or in sequence. The number of bit flips (i.e., the Hamming distance) may indicate the number of bits that change from "0" to "1" or from "1" to "0" in data stored in a memory cell. Therefore, for the first data and hash candidate C1, each bit of "100100" is compared to a corresponding bit of "001110," and thus a Hamming distance of 3 is obtained.

At this time, the controller 110 may choose a data and hash candidate with minimum bit flips (i.e., the minimum Hamming distance) among the data and hash candidates C1 to C4 as an encoded data and hash for the write data "1001," at S340. In accordance with the present embodiment shown in FIG. 3, the controller 110 may choose the third data and hash candidate C3 with two bit flips among the data and hash candidates C1 to C4 as the encoded data and hash.

The controller 110 may store the encoded data and hash in the resistive change memory 120.

FIG. 4 illustrates a logic operation for generating a data candidate in accordance with an embodiment. This logic operation of FIG. 4 will be described with reference to FIG. 3.

For example, in order to generate the data candidate, it is assumed that bit positions, e.g., b3, b2, b1, and b0, of the write data "1001" have "11," "10," "01," and "00," respectively. The third hash candidate Hash2 having "10," as shown in FIG. 3, is used. In this case, the changed bit positions of Table 1 below may be obtained by performing XOR operations on the bit positions of the write data and the third hash candidate Hash2.

That is, a new bit position b1, i.e., "01," is obtained by performing an XOR operation on the bit position b3, i.e., "11," of the write data and the third hash candidate Hash2, i.e., "10." A new bit position b0, i.e., "00," is obtained by performing an XOR operation on the bit position b2, i.e., "10," of the write data and the third hash candidate Hash2, i.e., "10." A new bit position b3, i.e., "11," is obtained by performing an XOR operation on the bit position b1, i.e., "01," of the write data and the third hash candidate Hash2, i.e., "10." And a new bit position b2, i.e., "10," is obtained by performing an XOR operation on the bit position b0, i.e., "00," of the write data and the third hash candidate Hash2, i.e., "10."

Finally, the new bit positions b1, b0, b3, and b2 is obtained by performing XOR operations on the original bit positions b3, b2, b1, and b0, i.e., "11," "10," "01," and "00," and the third hash candidate Hash2, i.e., "10" as shown in FIG. 4.

TABLE 1

| Bit position | 11 | 10 | 01 | 00 |
|---|---|---|---|---|
| Hash candidate | 10 | 10 | 10 | 10 |

TABLE 1-continued

| Changed bit position | 01 | 00 | 11 | 10 |
|---|---|---|---|---|
| Input data | 1 | 0 | 0 | 1 |
| Third data candidate | 0 | 1 | 1 | 0 |

That is, according to the third hash candidate Hash2, the first bit position b0 of the write data may change to the third bit position b2, the second bit position b1 of the write data may change to the fourth bit position b3, the third bit position b2 of the write data may change to the first bit position b0, and the fourth bit position b3 of the write data may change to the second bit position b1.

Similarly, for the bit positions "11," "10," "01," and "00" of the write data, first, second, and fourth data candidates may be obtained by performing an XOR operation using a first hash candidate Hash0 "00," an XOR operation using a second hash candidate Hash1 "01," and an XOR operation using a fourth hash candidate Hash3 "11," respectively.

In accordance with the present embodiments, the method for extending the lifetime of a resistive change memory and a data storage system using the same not only minimizes bit flips using data shuffling, but also hides stuck-at faults, thereby extending the lifetime of the resistive change memory.

Although various embodiments have been described for illustrative purposes, it will be apparent to those skilled in the art that various changes and modifications may be made without departing from the spirit and scope of the invention as defined in the following claims.

What is claimed is:

1. A method for extending the lifetime of a resistive change memory, the method comprising:
    generating data and hash candidates by shuffling bit positions of write data to be written in the resistive change memory with hash candidates in response to a write request for the resistive change memory, each of the data and hash candidates being a set of shuffled write data and a corresponding one of the hash candidates;
    calculating Hamming distances of the generated data and hash candidates from stored data and a stored hash that are pre-stored in the resistive change memory;
    matching stuck data at a predetermined bit in the resistive change memory with the generated data and hash candidates when the stuck data is at the predetermined bit of the stored data, and excluding mismatched data and hash candidates that are mismatched with the stuck data among the generated data and hash candidates;
    finding a data and hash candidate with the shortest Hamming distance among matched data and hash candidates that are matched with the stuck data among the generated data and hash candidates, the matched data and hash candidates containing data coinciding with the stuck data at the predetermined bit, and choosing the found data and hash candidate as an encoded data and hash; and
    storing the encoded data and hash in the resistive change memory.

2. The method of claim 1, further comprising:
    determining whether the resistive change memory receives a read request without receiving the write request for the resistive change memory; and
    reading the stored data and the stored hash and decoding the stored data by shuffling bit positions of the stored data with the stored hash when the resistive change memory receives the read request.

3. The method of claim 2, wherein the decoding of the stored data comprises generating decoded data by performing XOR operations on the stored hash and the bit positions of the stored data.

4. The method of claim 2, wherein the decoding of the stored data comprises generating decoded data by performing XNOR operations on the stored hash and the bit positions of the stored data.

5. The method of claim 1, wherein the generating of the data and hash candidates comprises generating the data and hash candidates by performing XOR operations on the bit positions of the write data and each of the hash candidates.

6. The method of claim 1, wherein the generating of the data and hash candidates comprises generating the data and hash candidates by performing XNOR operations on the bit positions of the write data and each of the hash candidates.

7. The method of claim 1, wherein the number of the generated data and hash candidates indicates the number of data bits written at each write time.

8. A method for extending the lifetime of a resistive change memory, the method comprising:
generating data and hash candidates by shuffling bit positions of write data to be written in the resistive change memory with hash candidates when the resistive change memory receives a write request, each of the data and hash candidates being a set of shuffled write data and a corresponding one of the hash candidates;
calculating Hamming distances of the generated data and hash candidates from stored data and a stored hash that are pre-stored in the resistive change memory;
finding a data and hash candidate with the shortest Hamming distance among the generated data and hash candidates and choosing the found data and hash candidate as an encoded data and hash; and
storing the encoded data and hash in the resistive change memory.

9. The method of claim 8, further comprising:
determining whether the resistive change memory receives a read request when the resistive change memory has not received a write request; and
reading the stored data and the stored hash and decoding the stored data by shuffling bit positions of the stored data with the stored hash when the resistive change memory receives the read request.

10. The method of claim 9, wherein the decoding of the stored data comprises generating decoded data by performing XOR operations on the stored hash and the bit positions of the stored data.

11. The method of claim 9, wherein the decoding of the stored data comprises generating decoded data by performing XNOR operations on the stored hash and the bit positions of the stored data.

12. The method of claim 8, wherein the generating of the data and hash candidates comprises generating the data and hash candidates by performing XOR operations on the bit positions of the write data and each of the hash candidates.

13. The method of claim 8, wherein the generating of the data and hash candidates comprises generating the data and hash candidates by performing XNOR operations on the bit positions of the write data and each of the hash candidates.

14. The method of claim 8, wherein the number of the data and hash candidates indicates the number of data bits written at each write time.

15. A data storage system comprising:
a controller configured to generate data and hash candidates by shuffling bit positions of write data to be written in a resistive change memory with hash candidates, each of the data and hash candidates being a set of shuffled write data and a corresponding one of the hash candidates, calculating Hamming distances of the generated data and hash candidates from stored data and a stored hash that are pre-stored in the resistive change memory, matching stuck data at a predetermined bit in the resistive change memory with the generated data and hash candidates when there is the stuck data at the predetermined bit of the stored data, excluding mismatched data and hash candidates that are mismatched with the stuck data among the generated data and hash candidates, choosing a data and hash candidate with the shortest Hamming distance among matched data and hash candidates as an encoded data and hash, and storing the encoded data and hash in the resistive change memory,
wherein the matched data and hash candidates are matched with the stuck data among the generated data and hash candidates, and each of the matched data and hash candidates contains data coinciding with the stuck data at the predetermined bit.

16. The data storage system of claim 15, wherein the number of the generated data and hash candidates indicates the number of data bits written at each write time.

17. The data storage system of claim 15, wherein the shuffling operation comprises an XOR or XNOR operation.

18. A data storage system comprising:
a controller configured to generate data and hash candidates by shuffling bit positions of write data to be written in a resistive change memory with hash candidates when the resistive change memory receives a write request, calculating Hamming distances of the generated data and hash candidates from stored data and a stored hash that are pre-stored in the resistive change memory, choosing a data and hash candidate with the shortest Hamming distance among the generated data and hash candidates as an encoded data and hash, and storing the encoded data and hash in the resistive change memory,
wherein each of the data and hash candidates is a set of shuffled write data and a corresponding one of the hash candidates.

19. The data storage system of claim 18, wherein the number of the generated data and hash candidates indicates the number of data bits written at each write time.

20. The data storage system of claim 18, wherein the shuffling operation comprises an XOR or XNOR operation.

* * * * *